United States Patent [19]

Rose et al.

[11] Patent Number: 5,190,703

[45] Date of Patent: Mar. 2, 1993

[54] PLASMA REACTOR CHAMBER

[75] Inventors: Peter W. Rose; Stephen L. Kaplan, both of San Carlos, Calif.

[73] Assignee: Himont, Incorporated, Foster City, Calif.

[21] Appl. No.: 633,547

[22] Filed: Dec. 24, 1990

[51] Int. Cl.[5] ............................................. C23C 16/50
[52] U.S. Cl. ............................. 264/22; 427/569; 118/723; 422/186.05; 422/186.06
[58] Field of Search ..................... 118/723; 427/39; 422/186.05, 186.06; 264/22

[56] References Cited

U.S. PATENT DOCUMENTS

| | | | |
|---|---|---|---|
| 3,414,702 | 12/1968 | Stauffer | 219/121.33 |
| 3,518,484 | 6/1970 | Maskell | 219/121 |
| 4,520,757 | 6/1985 | Nath | 118/723 |
| 4,641,060 | 2/1987 | Dandl | 315/111.71 |
| 4,713,585 | 12/1987 | Ohno et al. | 315/111.81 |
| 4,767,641 | 8/1988 | Kieser et al. | 427/38 |
| 4,940,521 | 7/1990 | Dinter et al. | 204/174 |

Primary Examiner—Richard Bueker
Attorney, Agent, or Firm—Rosenblum, Parish & Isaacs

[57] ABSTRACT

The present invention includes a plasma reactor chamber, which is generally constructed such that a large opening exists in a wall of the chamber. The reactor chamber is deployed remotely from a control console, such as on a robotic arm. A plasma generating means, such as RF electrodes is disposed within the chamber and a flexible vacuum seal is engaged to the outer edge of the chamber wall, surrounding the opening. Operating components, such as a vacuum pump, plasma gas supply and RF generator are disposed within the control console, and various supply lines join the operating components to the reactor chamber. In operation, the reactor chambler is placed against a portion of a surface that is to be treated, and a low pressure plasma is created within the chamber to treat the zone of the surface enclosed within the seal of the chamber. Particularly shaped seals for irregularly shaped surfaces and a rolling seal for movement of the reactor chamber relative to a surface are within the contemplation of the invention.

21 Claims, 2 Drawing Sheets

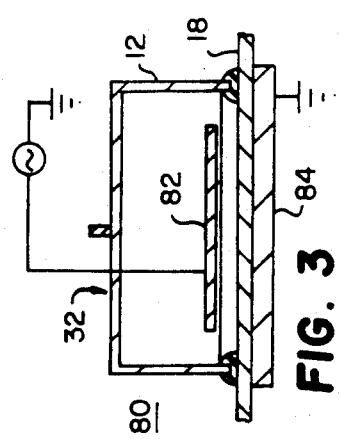
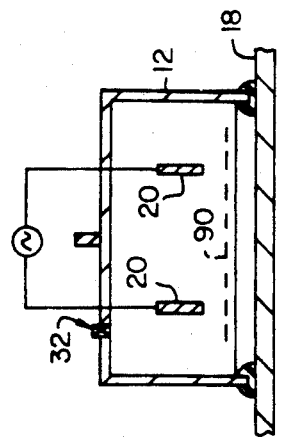
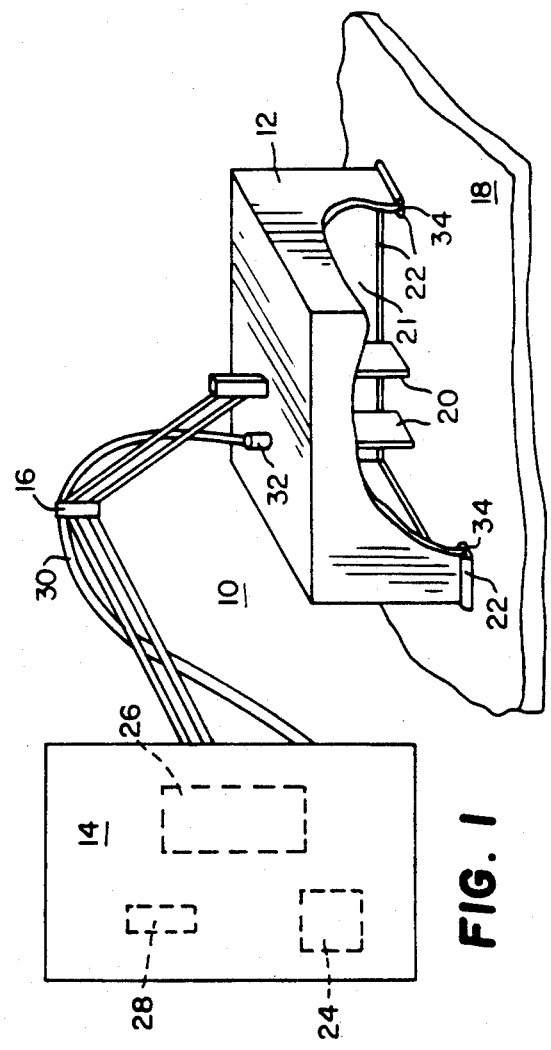
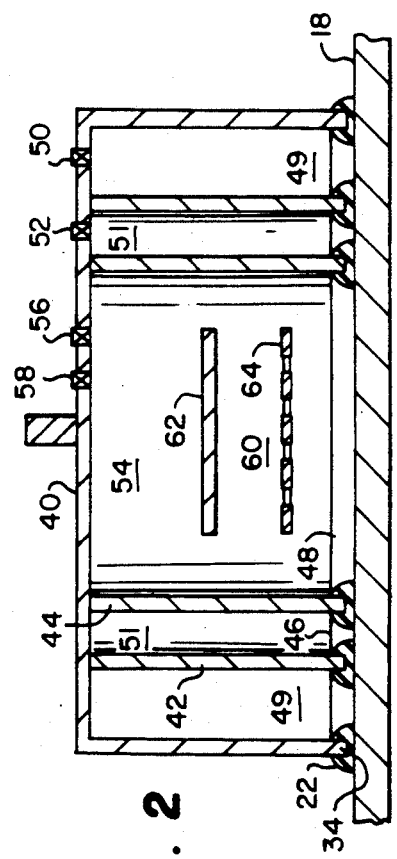

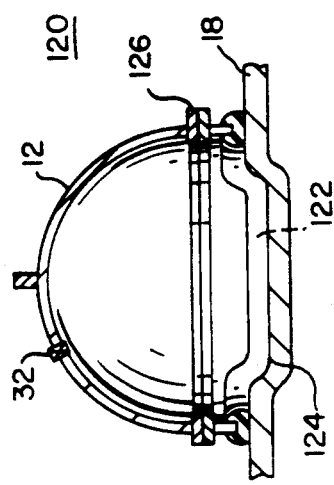
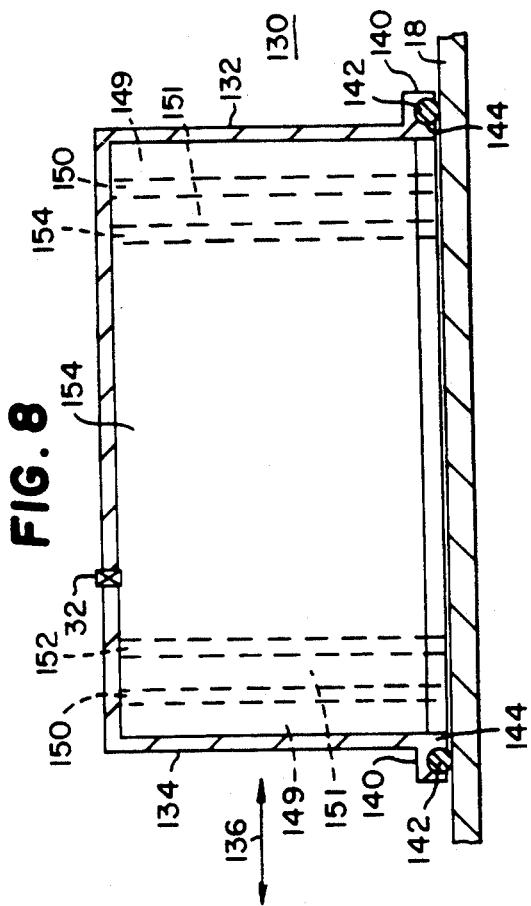
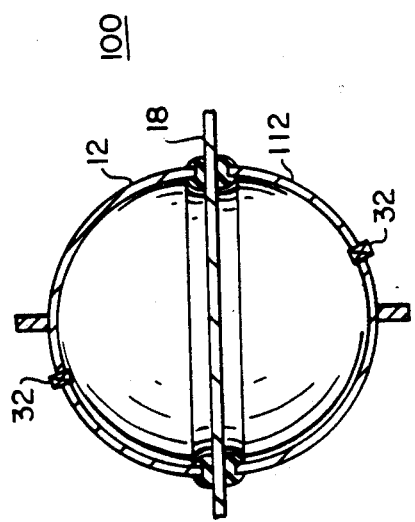
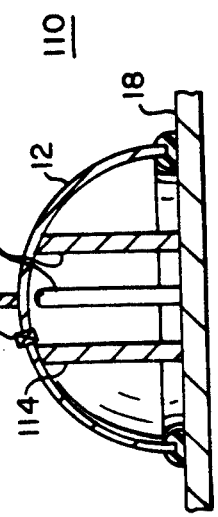

PLASMA REACTOR CHAMBER

BACKGROUND OF THE INVENTION

1. Field of the Invention

The present invention relates generally to plasma reactor chambers, and more particularly to a plasma reactor chamber having a treatment surface opening in a wall of the chamber, with a vacuum seal disposed on the reactor wall surrounding the opening.

2. Brief Description of the Prior Art

The applicants are generally unaware of prior art wherein the reactor chamber walls are not fully enclosed to support a low pressure environment. Thus, the utilization of a reactor chamber having a treatment opening in a chamber wall, wherein the surface to be treated covers the opening in the wall of the chamber, and wherein a low pressure seal surrounds the edge of the opening in the chamber wall to permit the establishment of a low pressure environment, appears novel.

Known prior art includes U.S. Pat. No. 4,767,641, Plasma Treatment Apparatus, issued Aug. 30, 1988 to Keiser et al. This patent describes an open sided anode that is disposed within a vacuum chamber. A movable treatment surface is passed by the annode for plasma treatment. The shape of the reactor chamber which encloses the anode within the low pressure environment is indefinite. Further prior art, consisting of U.S. Pat. No. 3,414,702, issued Dec. 3, 1968 to L. H. Stauffer; U.S. Pat. No. 3,518,484, issued Jun. 30, 1970 to C. W. A. Maskell; and U.S. Pat. No. 4,713,585, issued Dec. 15, 1987 to Ohno, et al., teach particular types of low pressure chambers for electron beam and ion beam devices. However, these devices do not reveal an open faced reactor chamber wherein the surface to be treated forms one wall of the reactor.

U.S. Pat. No. 4,940,521 issued Jul. 10, 1990 to Dinter et al. teaches a device for treating a continuous strip that is disposed upon a rotating drum. Dinter's device achieves an atmospheric pressure discharge process utilizing a metal cover to shield high Voltage electrodes from the work place and to contain a liquid aerosol in the glow region.

SUMMARY OF THE INVENTION

It is an object of the present invention to eliminate the need for large, expensive reaction chambers when the area to be treated is small.

It is another object of the present invention to provide a plasma treatment chamber having a small, efficient power supply and vacuum pump.

It is a further object of the present invention to provide a reaction chamber having a rapid throughput time.

It is yet another object of the present invention to provide a plasma reactor chamber that is suitable for the treatment of small areas of a large surface.

It is yet a further object of the present invention to provide a plasma reactor chamber that is suitable for mating with selected portions of irregularly shaped surfaces to provide plasma treatment to small portions of the surfaces.

The present invention includes a plasma reactor chamber, having an open wall portion, such as a generally hemispherical shape, such that a large opening exists in one wall of the chamber. The reactor chamber may be deployed remotely from a control console, such as on a robotic arm. A plasma generating means, such as RF electrodes, is disposed within the chamber and a vacuum seal is engaged to the outer edge of the chamber wall, surrounding the opening. Operating components, such as a vacuum pump, plasma gas supply and RF generator are disposed within the control console, and various supply lines join the operating components to the reactor chamber. In operation, the reactor chamber is placed against a portion of a surface that is to be treated, and a low pressure plasma is created within the chamber to treat the zone of the surface enclosed within the seal of the chamber. Particularly shaped seals for irregularly shaped surfaces and a rolling seal for movement of the reactor chamber relative to a surface are within the contemplation of the invention.

It is an advantage of the present invention that it eliminates the need for large, expensive reaction chambers when the area to be treated is small.

It is another advantage of the present invention that it provides a plasma treatment chamber having a small, efficient power supply and vacuum pump.

It is a further advantage of the present invention that it provides a reaction chamber having a rapid throughput time.

It is yet another advantage of the present invention that it provides a plasma reactor chamber that is suitable for the treatment of small areas of a large surface.

It is yet a further advantage of the present invention that it provides a plasma reactor chamber that is suitable for mating with selected portions of irregularly shaped surfaces to provide plasma treatment to small portions of the surfaces.

These and other objects, features and advantages of the present invention will no doubt become apparent to those of ordinary skill in the art after having read the following detailed description of the preferred embodiments which are illustrated in the several figures of the drawing.

IN THE DRAWING

FIG. 1 depicts the plasma reactor system of the present invention including a rectangular chamber having a cutaway portion;

FIG. 2 depicts an alternative embodiment of the reactor chamber having multiple low pressure zones;

FIG. 3 depicts an alternative embodiment of the reactor chamber having an alternative RF electrode configuration;

FIG. 4 depicts an alternative embodiment of the reactor chamber of the present invention having a shielding screen disposed therewithin;

FIG. 5 depicts an alternative reactor chamber embodiment having two vacuum chambers to equalize stress on the treatment surface;

FIG. 6 is yet another alternative embodiment of the plasma reactor chamber of the present invention having support columns disposed therewithin to relieve stress on the treatment surface;

FIG. 7 depicts yet a further alternative embodiment of the plasma reactor chamber of the present invention having a shaped seal for mating engagement with an irregularly shaped surface; and FIG. 8 depicts still another alternative embodiment of the plasma reactor chamber of the present invention having a rolling seal for movement of the reactor chamber relative to a surface during treatment.

DESCRIPTION OF THE PREFERRED EMBODIMENT

Briefly, according to the present invention, an open-sided chamber is placed upon a surface. The surface becomes one wall of a closed treatment chamber and a vacuum seal is employed about the edge of the chamber wall opening to permit the establishment and maintenance of a vacuum within the closed chamber. The surface to be treated may be the surface enclosed within the chamber or any portion of the enclosed surface or an object placed upon the enclosed surface. A plasma is then struck within the chamber and the treatment of the area or part is accomplished. The chamber is preferably rectangular or cylindrical in shape, although a hemispherically shaped chamber is within the contemplation of the invention. In the preferred embodiment, the chamber is mounted upon a robotic arm, however it is contemplated that the chamber could be fixed and the surface to be treated could be mobile.

As is depicted in detail in FIG. 1, the present invention 10 includes a generally rectangular shaped reactor chamber 12 which is engaged to a control console 14 by a maneuverable arm 16. The arm 16 may be manually operated or robotically controlled. In operation, the reactor chamber 12 is placed upon a treatment surface 18 and a plasma is created within the chamber 12 to treat the portion of the surface 18 within the chamber 12. The chamber 12 is shown with a cutaway segment to permit viewing of the interior.

To create a plasma within the chamber 12, the preferred embodiment utilizes RF electrodes 20 that are engaged to the inside surface of the wall 21 that forms the reactor chamber 12. The plasma is then created within the chamber at a low pressure utilizing an appropriate gas atmosphere. To facilitate the maneuverability of the reactor chamber 12, a vacuum pump 24, RF generator 26 and plasma gas source 28 are disposed within the control console 14. Supply lines 30 are deployed along the arm 16 from suitable connectors 32 engaged in the chamber wall 21 to the sources 24, 26 and 28 within the control console 14. To facilitate the maintenance of a low pressure environment within the reactor chamber 12, a vacuum seal 22 is engaged to the edge 34 of the chamber wall opening. It is therefore to be realized that the reactor chamber 12 can be manually or robotically placed at different locations upon the surface 18, whereupon a plasma can be struck to treat localized portions of the surface 18. Additionally, small parts can be placed upon the surface 18, within the chamber 12 for treatment. Thus, small parts can be rapidly and inexpensively treated within the localized volume enclosed by the reactor chamber 12.

It is within the contemplation of the invention that a plasma may be created within the low pressure environment of the chamber by means other than RF power. Thus, the utilization of electromagnetic radiation within other frequency ranges that are known to be capable of creating a plasma are contemplated.

An alternative embodiment of the reactor chamber 40 is depicted in FIG. 2. The reactor chamber 40 has two internal, co-axially aligned, cylindrical wall members, 42 and 44. Each cylindrical wall 42 and 44 is sealingly engaged to the internal wall of the chamber 40, and forms concentric volumes within the chamber 40. Seals 46 and 48 are engaged to the outer edges of the walls 42 and 44, respectively, such that three separate pressurizable zones are created when the chamber 40 is placed upon a surface 18. An outer zone 49 formed between the wall 42 and the chamber wall 40 is engaged to a first vacuum exhaust 50 to provide a first low pressure zone. A second lower pressure zone 51 is created between walls 42 and 44, and a second vacuum exhaust 52 creates a lower pressure zone therein. A third low pressure zone 54, which is the plasma treatment zone, is enclosed by the wall 44 and the chamber wall 40, and a third vacuum exhaust 56 is provided to pump down the third zone 54 to the proper level. A representative pair of RF electrodes 60, generally shown as a plate electrode 62 and a perforated electrode 64, are disposed within the zone 54, and a process gas inlet 58 is provided in zone 54 to permit the creation of a suitable plasma. It is to be understood that the purpose of the multiple walls 42 and 44 is to facilitate the establishment and maintenance of a suitable low pressure environment for the plasma treatment within zone 54. To facilitate the creation and maintenance of a stable plasma within zone 54, the pressure in the second low pressure zone 51 is reduced below that of zone 54. A pressure gradient is thereby created between zones 54 and 51 which inhibits the entry of non-process gas from zone 51 into zone 54 and thereby promotes the stability of the plasma within zone 54. The air pressure within zone 49 is preferably less than atmospheric pressure and greater than the pressure in zone 51, whereby the maintenance of the lowest pressure within zone 51 is facilitated.

FIG. 3 depicts an alternative RF electrode configuration 80 which may be utilized in conjunction with the reactor chamber of the present invention. A powered electrode 82 is disposed within the reactor chamber 12. A grounded electrode 8 is disposed on the opposite side of the treatment surface 18 from the reactor 12. When the plasma is struck within the reactor chamber 12 it will be disposed within the chamber 12 between the electrodes 82 and 84, resulting in a more uniform plasma proximate the surface 18 to be treated. This configuration is particularly suitable when the surface 18 is electrically non-conductive.

FIG. 4 depicts an augmentation to the electrode configuration of FIG. 1 in which a perforated, electrically conductive screen 90 is engaged to the walls of the chamber 12 to provide shielding. The plasma is struck between the two electrodes 20, and the screen 90 provides shielding to the environment. It is to be noted that the grounded backing plate 84 of the embodiment depicted in FIG. 3 also provides shielding to the outside environment.

FIG. 5 depicts an alternative embodiment 100 of the present invention that is suitable for use where the treatment surface 18 is structurally unable to support the vacuum within the chamber 12. As depicted in FIG. 5, similar vacuum chambers 12 and 112, which are shown to be hemispherical in shape, are disposed on opposite sides of the surface 18. Each chamber 12 and 112 is engaged to the vacuum pump (not shown) through valves 32 such that the vacuum load stress upon the surface 18 is balanced; whereby the surface 18 is not distorted by the chamber vacuum, as may be the case with the other embodiments disclosed herein. Of course, either chamber 12, chamber 112, or both chambers 12 and 112 could be equipped with electrodes and a process gas inlet to create a plasma therewithin, such that treatment of the surface enclosed within the chamber could be accomplished.

FIG. 6 depicts another alternative chamber embodiment 110 for the treatment of a surface 18 that cannot resist the vacuum forces of the chamber 12. To prevent inward collapse of the surface 18 upon the creation of low pressure within the chamber 12, support columns 114 are disposed within the chamber 12. The support columns 114 are engaged at one end to the inner chamber wall and they extend to the surface 18 to resist the compressive load of the inward movement of the surface 18.

FIG. 7 depicts another alternative preferred embodiment 120 that is suitable for use upon an uneven treatment surface. As depicted therein, a shaped sealing member 122 is particularly shaped to conform to a cavity 124 in the treatment surface 18. An attachment flange 126 may be utilized to join the seal 122 to the opening of the reactor chamber 12. The utilization of the attachment flange 126 permits the chamber 120 to be utilized upon flat treatment surfaces in the manner described hereinabove, while allowing the attachment of particularly shaped seals (such as seal 122) when the chamber is utilized on irregularly shaped surfaces, such as surface 124.

FIG. 8 depicts yet a further alternative embodiment 130 of the present invention that is adapted for horizontal movement relative to a flat treatment surface 18. As depicted therein, the reaction chamber 130 is basically rectangular in shape, having straight side walls 132 and 134 disposed perpendicularly to the direction of movement 136 of the chamber 130 along the treatment surface 18. To permit lateral movement 136 yet maintain a low pressure plasma within the chamber 130, movable vacuum seals are provided upon the edge of each side wall 130 and 132. In the preferred embodiment, the seals that are disposed along the edges of the walls 132 and 134 perpendicular to the direction of relative movement 136 are rolling seals 140. Such seals have rollers 142 along with a foam rubber seal 144 to maintain a low pressure atmosphere therewithin while permitting movement. The seals in the chamber walls that are parallel to the direction of movement include a foam rubber that maintains its frictional engagement with the surface to support the low pressure environment while permitting lateral movement of the chamber. To facilitate the maintenance of a low pressure treatment zone, while permitting the slidable relative movement of the treatment surface, a plurality of inner walls may be formed within the chamber 130 to create multiple low pressure zones, similar to those depicted in FIG. 2 and described hereinabove. Of course, because the reactor chamber 130, as depicted in FIG. 8, includes parallel walls 132 and 134, the inner walls (comparable to walls 42 and 44 of FIG. 2) would be disposed in parallel relationship to walls 132 and 134. Such inner walls are shown in phantom in FIG. 8 as walls 150 and 152 which create low pressure zones 149 and 151. The treatment plasma would then be struck in the inner pressurized zone 154.

While the invention has been particularly shown and described with reference to certain preferred embodiments, it will be understood by those skilled in the art that various alterations and modifications in form and detail may be made therein. Accordingly, it is intended that the following claims cover all such alterations and modifications as may fall within the true spirit and scope of the invention.

What we claim is:

1. A plasma reactor comprising:
    a reactor chamber being formed by at least one chamber wall, said chamber wall having a treatment opening formed therein, said opening being identified by edges of said chamber wall;
    a vacuum seal being disposed upon said edges of said chamber wall to surround said opening;
    a plasma generation means having first portions thereof that are disposed within said chamber and functioning to create a plasma within said chamber;
    whereby said chamber wall with said seal disposed thereon may be placed upon a treatment surface to form an enclosed plasma reactor vessel wherein a plasma may be struck to treat said treatment surface.

2. A plasma reactor as described in claim 1, wherein said seal includes a movable surface engagement means, said surface engagement means functioning to maintain a sealing engagement with said surface while said reactor chamber and said surface are slideably moved relative to each other.

3. A plasma reactor as described in claim 1, wherein said first portions of said plasma generating means includes at least one RF electrode being engaged within said chamber.

4. A plasma reactor as described in claim 1, wherein said chamber is substantially rectangular in shape.

5. A plasma reactor as described in claim 4, wherein said treatment opening is created by the removal of a wall of said rectangular chamber.

6. A plasma reactor as described in claim 1, wherein said chamber is substantially cylindrical in shape.

7. A plasma reactor as described in claim 1, wherein said chamber is substantially hemispherical in shape.

8. A plasma reactor as described in claim 1, wherein said surface to be treated is uneven in shape and said seal is formed in a shape which corresponds to said shape of said surface.

9. A plasma reactor as described in claim 1, wherein said chamber includes at least one inner wall, said inner wall being engaged to said chamber wall and disposed to create a plurality of separate low pressure zones within said chamber.

10. A plasma reactor as described in claim 9 wherein each said inner wall includes a seal means disposed thereon to facilitate the formation of said separate low pressure zones.

11. A method for treating a portion of a surface with a plasma, comprising:
    placing a portion of a surface to be treated proximate an opening in a wall of a plasma reactor chamber, said chamber having a seal engaged to said wall and surrounding said opening, said seal being disposed to surround and sealingly engage said portion of said surface;
    creating a plasma within said reactor chamber, whereby said portion of said surface will be exposed to said plasma for treatment.

12. A method for treating a portion of a surface with a plasma as described in claim 11, wherein said step of creating a plasma within said chamber includes the steps of introducing a process gas within said chamber, creating a low pressure environment within said chamber and introducing electromagnetic energy within said chamber to create a plasma therewithin.

13. A method for treating a portion of a surface with a plasma as described in claim 11, wherein said step of placing said portion of said surface proximate said opening includes the steps of engaging said chamber to a movable arm, and locating portions of equipment necessary to create said plasma at a location remote from said chamber, and supplying a process gas, electromagnetic power and a vacuum exhaust to said chamber utilizing supply lines that are connected between said chamber and said equipment.

14. A plasma reactor comprising:
a reactor chamber being formed by at least one chamber wall, said chamber wall having a treatment opening formed therein, said opening being identified by edges of said chamber wall;
a vacuum seal being disposed upon said edges of said chamber wall to surround said treatment opening;
a plasma generation means having first portions thereof that are disposed within said chamber and functioning to create a plasma within said chamber;
said first portions of said plasma generating means including at least one electrode being engaged within said chamber to said chamber wall, a vacuum means being engaged to said chamber wall and functioning to create a low pressure environment within said chamber, and a process gas introduction means being engaged to said chamber wall and functioning to introduce a process gas into said chamber;
whereby said chamber wall with said seal disposed thereon may be placed upon a treatment surface to form an enclosed plasma reactor vessel wherein a plasma may be struck to treat said treatment surface.

15. A plasma reactor comprising:
a reactor chamber being formed by at least one chamber wall, said chamber wall having a treatment opening formed therein, said opening being identified by edges of said chamber wall;
a seal being disposed upon said edges of said chamber wall to surround said treatment opening;
a plasma generation means having first portions thereof that are disposed within said chamber and functioning to create a plasma within said chamber;
said first portions of said plasma generating means including at least one electrode being engaged within said chamber to said chamber wall, a vacuum means being engaged to said chamber wall and functioning to create a low pressure environment within said chamber, and a process gas introduction means being engaged to said chamber wall and functioning to introduce a process gas into said chamber;
whereby said chamber wall with said seal disposed thereon may be placed upon a treatment surface to form an enclosed plasma reactor vessel wherein a plasma may be struck to treat said treatment surface;
said reactor chamber being engaged to a movable arm, and wherein a second portion of said plasma generating means is disposed remotely from said reactor chamber, and supply lines are disposed along said arm from said second portion of said plasma generating means to said first portion of said plasma generating means.

16. A plasma reactor as described in claim 15, wherein said surface to be treated is uneven in shape and said seal is formed in a shape which corresponds to said shape of said surface.

17. A plasma reactor as described in claim 15, wherein said seal includes a movable surface engagement means, said surface engagement means functioning to maintain a sealing engagement with said surface while said reactor chamber and said surface are slideably moved relative to each other.

18. A plasma reactor as described in claim 15, wherein said chamber includes at least one inner wall, said inner wall being engaged to said chamber wall and disposed to create a plurality of separate low pressure zones within said chamber.

19. A plasma reactor as described in claim 18 wherein each said inner wall includes a seal means disposed thereon to facilitate the formation of said separate low pressure zones.

20. A plasma reactor comprising:
a reactor chamber being formed by at least one chamber wall, said chamber wall having a treatment opening formed therein, said opening being identified by edges of said chamber wall;
a seal being disposed upon said edges of said chamber wall to surround said opening;
a plasma generation means having first portions thereof that are disposed within said chamber and functioning to create a plasma within said chamber;
whereby said chamber wall with said seal disposed thereon may be placed upon a treatment surface to form an enclosed plasma reactor vessel wherein a plasma may be struck to treat said treatment surface;
said reactor chamber being engaged to a movable arm.

21. A plasma reactor as described in claim 20, wherein a second portion of said plasma generating means is disposed remotely from said reactor chamber, and supply lines are disposed along said arm from said second portion of said plasma generating means to said first portion of said plasma generating means.

* * * * *